(12) United States Patent
King et al.

(10) Patent No.: US 6,388,514 B1
(45) Date of Patent: May 14, 2002

(54) CLASS D HIGH VOLTAGE AMPLIFIER SYSTEM WITH ADAPTIVE POWER SUPPLY

(75) Inventors: Ray King, Carolina Beach, NC (US); John Parry, Hermosa Beach; Jonathan Adams, Rancho Palos Verdes, both of CA (US)

(73) Assignee: International Rectifier Corporation, El Segundo, CA (US)

( * ) Notice: Subject to any disclaimer, the term of this patent is extended or adjusted under 35 U.S.C. 154(b) by 0 days.

(21) Appl. No.: 09/471,015

(22) Filed: Dec. 23, 1999

Related U.S. Application Data

(60) Provisional application No. 60/113,638, filed on Dec. 23, 1998.

(51) Int. Cl.[7] .................................................. H03F 3/38
(52) U.S. Cl. ........................ 330/10; 330/207 A; 330/251
(58) Field of Search ............................... 330/10, 207 A, 330/251

(56) References Cited

U.S. PATENT DOCUMENTS 5,442,317 A * 8/1995 Stengel ........................ 330/10
5,982,231 A * 11/1999 Nalbant ....................... 330/10

FOREIGN PATENT DOCUMENTS

JP          62-277806    * 12/1987   ................... 330/10

* cited by examiner

*Primary Examiner*—Michael B Shingleton
(74) *Attorney, Agent, or Firm*—Ostrolenk, Faber, Gerb & Soffen, LLP

(57) ABSTRACT

A Class D amplifier system utilizing high voltage level shifting technology and an adaptive power supply which adjusts the magnitude of the output voltage based on audio input levels to reduce switching losses at low audio input levels. The amplifier system of the present invention also removes any DC offset at the output by providing an equal positive and negative power supply with respect to ground.

11 Claims, 4 Drawing Sheets

CLASS D HIGH VOLTAGE AMPLIFIER SYSTEM WITH ADAPTIVE POWER SUPPLY

This application claims the benefit of U.S. Provisional Application No. 60/113,638, filed Dec. 23, 1998.

BACKGROUND OF INVENTION

1. Field of the Invention

The present invention relates to a class D amplifier system utilizing high voltage level shifting technology and an adaptive power supply, which adjusts output voltage based on audio input levels.

2. Description of the Related Art

FIG. 1 shows a typical prior art single-ended switching audio amplifier. In this typical implementation, the power supply voltage (i.e., the voltage across C2) is fixed and is controlled by PWM power supply control circuit 103. Audio-to-PWM conversion circuit 101 converts the audio input signal into a PWM signal (the carrier frequency of which must be significantly higher than the desired maximum output frequency) which, via half-bridge driver 102, controls the switching of MOSFET devices Q2 and Q3. The alternate switching of MOSFETs Q2 and Q3 provides a high voltage PWM square wave at point X. Capacitor C1 removes any DC bias in the output (which would be damaging to the output speaker load), and inductor L1 and capacitor C3 form a low pass LC filter to remove the switching frequency and leave the desired audio power signal at the load S1.

Capacitor C1 must be large, so as to not affect the output signal, and is commonly a cause of dissipation and undesirable power loss. There is a need in the art to reduce this unwanted power loss. Furthermore, even when there is no audio input or a very low level audio input signal, MOSFETs Q2 and Q3 continue to switch based on the control PWM signal, resulting in switching losses which are proportional to the power supply voltage. There is a need in the art to reduce these switching losses.

FIG. 2 shows a typical prior art full bridge switching audio amplifier, wherein like elements from FIG. 1 are represented by like reference numbers. The full bridge switching audio amplifier system has the advantage of not requiring the DC block capacitor C1 of the single-ended circuit in FIG. 1; however, the circuit of FIG. 2 requires the use of two half bridge drivers 102A and 102B (or, alternatively, a single full bridge driver) and an additional two switches (Q4 and Q5). In the implementation shown in FIG. 2, switches Q3 and Q4 are switched on together and switches Q2 and Q5 are switched on together. This results in an apparent AC waveform being supplied to the load S1. Another disadvantage of the circuit of FIG. 2 is the increased complication of the filter network, comprising two inductors (L1 and L2) and one capacitor (C2). The circuit of FIG. 2 reduces the losses associated with the use of the DC block capacitor (C1) of FIG. 1; however, the overall cost and complication of the circuit is also increased significantly. One remaining issue is that the circuit of FIG. 2 still operates with a fixed power supply voltage, and therefore the switching losses remain the same as the circuit of FIG. 1.

SUMMARY OF THE INVENTION

The Class D amplifier system of the present invention overcomes the disadvantages of the prior art circuits discussed above and provides a simple, reliable, low-cost audio amplifier circuit. The circuit of the present invention advantageously removes any DC offset at the output, and also reduces the switching losses in the power output stage by adaptively controlling the power supply based on the incoming audio signal levels.

More specifically, the Class D amplifier system of the present invention includes level-shift PWM circuitry for level-shifting and converting the input audio signal into a pulse width modulated signal, gate drive circuitry for receiving the level-shifted pulse width modulated input audio signal and converting the signal into gate drive signals for a half-bridge transistor circuit, adaptive power supply control circuitry for adjusting the magnitude of the voltage supplied to the half-bridge in accordance with the magnitude of the input signal, and a filter for removing the switching frequency from the half-bridge output to generate an amplified audio signal.

The Class D amplifier system of the present invention preferably further includes DC offset compensation circuitry for receiving the amplified output audio signal and feeding back to the input a small level of DC offset to eliminate any DC offset in the amplified output signal. Preferably, the level-shift PWM circuitry, the gate drive circuitry, the adaptive power supply control circuitry, and the DC offset compensation circuitry are all integrated in one chip.

Other features and advantages of the present invention will become apparent when the following description is read in conjunction with the accompanying drawings.

DETAILED DESCRIPTION OF THE PREFERRED EMBODIMENT

Figure 1:
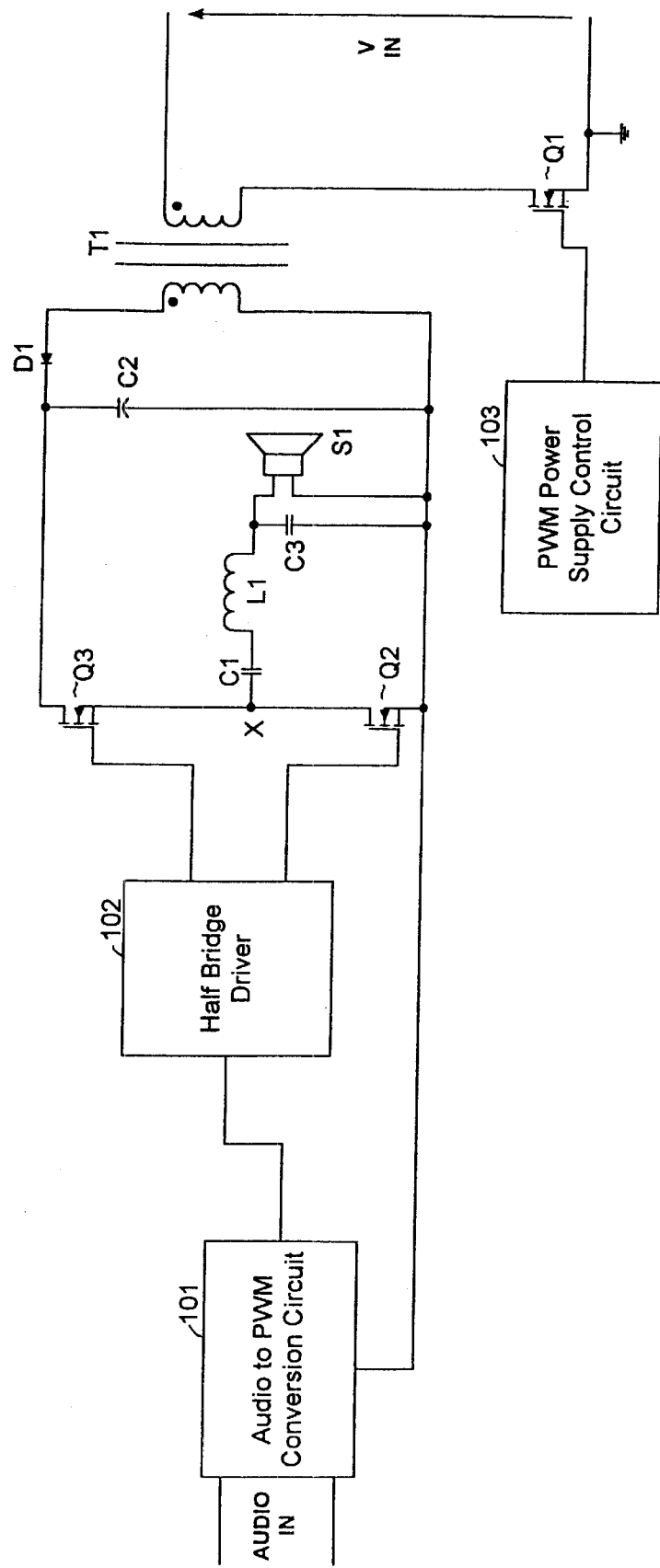
FIG. 1 is a block diagram showing a typical prior art single ended half-bridge class D switching amplifier.
Figure 2:
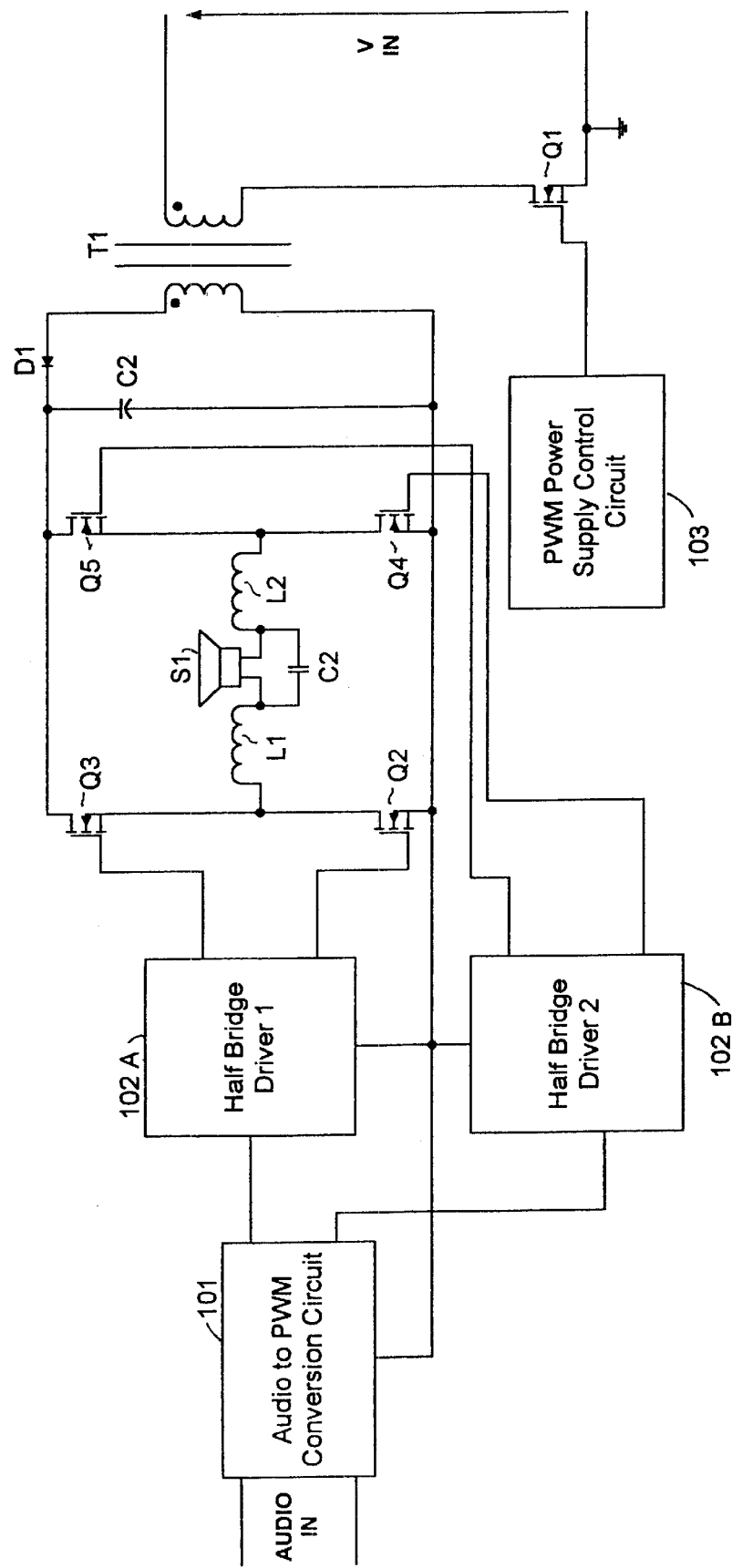
FIG. 2 is a block diagram showing a typical prior art full bridge Class D switching amplifier.
Figure 3:
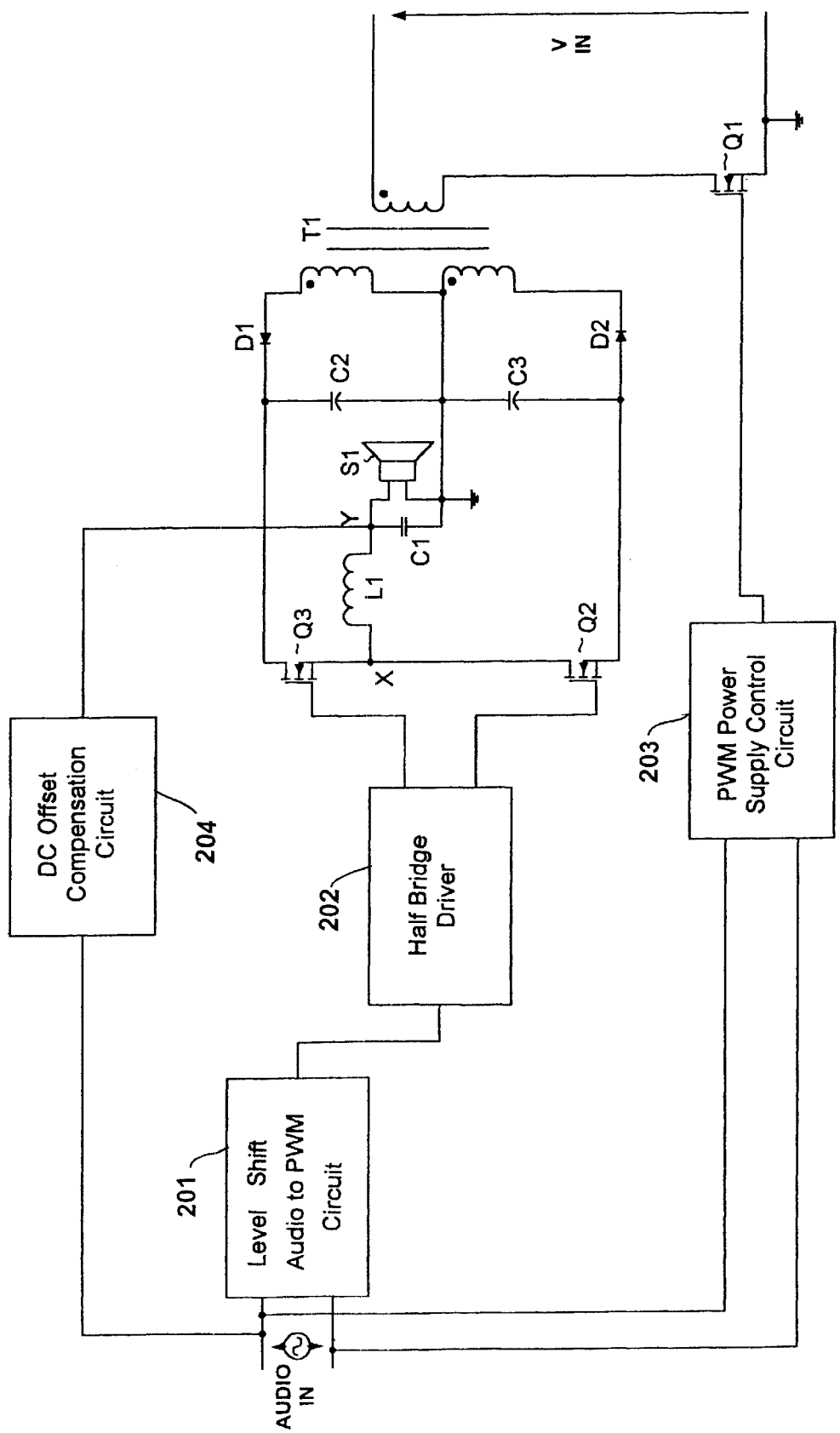
FIG. 3 is a block diagram showing the Class D amplifier system of the present invention using an adaptive positive and negative power supply and high voltage level shifting to reduce the losses in the circuit.

A block diagram of the Class D amplifier circuit of the present invention is shown in FIG. 3. The circuit of the present invention advantageously removes any DC offset at the output by providing an equal positive and negative power supply with respect to ground. The power supply is controlled by PWM power supply control circuit 203, which in turn drives switch Q1. Transformer T1, diodes D1 and D2, and capacitors C2 and C3 generate a nominally equal positive and negative supply voltage.

The audio input signal (referenced to ground) is fed into level-shift audio to PWM circuit 201, which converts the audio signal into a PWM control signal and level shifts this PWM signal down to the negative supply rail. The PWM signal feeds the input of a high voltage level shifting half bridge gate driver 202, which is also referenced to the negative supply rail. Half bridge gate driver 202 then drives two switches (Q2 and Q3) to create a square wave output at point X. This square wave is an AC square wave with a maximum voltage of +V and a minimum voltage of -V (where V is the power supply voltage). With no audio input, the PWM duty cycle is 50% which results in an average voltage at point X of zero volts, therefore eliminating DC offset at the output.

Since there may be some inequalities in the positive and negative power supply rails, a 50% duty cycle may not quite result in a zero volt average at point X. Therefore, a DC offset compensation circuit 204 is added which monitors the output voltage at point Y, and feeds back a small level DC offset (proportional to the DC offset at the output) to the input of level-shift audio to PWM circuit 201 to adjust the output until there is no DC offset.

To reduce the switching losses in switching devices Q2 and Q3, the power supply voltage is adjusted based on the audio input so that with no audio input, the power supply voltage is very low, reducing the switching losses to a very small amount. In the case of a high level audio input, the power voltage is increased by an amount proportional to the audio input level. This results in low switching losses with no or a very low input signal level, while maintaining the capability to supply high level outputs to the speaker load S1.

Figure 4:
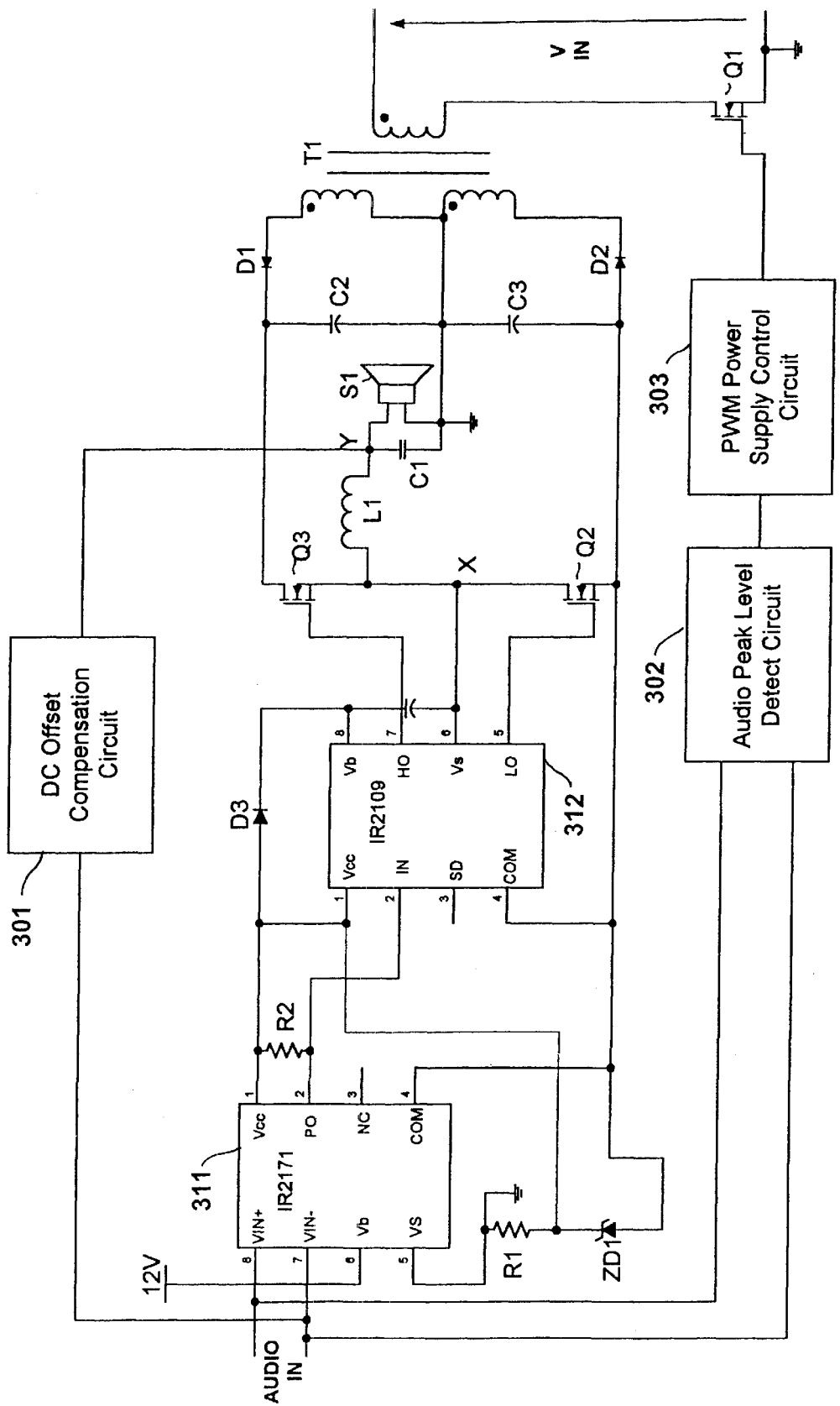
FIG. 4 is a schematic showing the preferred implementation of the Class D amplifier system of the present invention.

Referring now to FIG. 4, a circuit schematic showing a preferred implementation of the Class D amplifier system of the present invention is shown.

A peak level detect circuit 302 detects the peak level of the audio input signal and feeds this control signal into a PWM power supply circuit 303. PWM power supply control circuit 303 controls the switching of device Q1 based upon the input signal provided by peak level detect circuit 302. The switching of device Q1 in turn controls the energy in transformer T1, which in turn controls the output voltage level of the transformer secondary windings. Diodes D1 and D2 rectify the voltage produced at the secondary windings, and capacitors C2 and C3 smooth the resultant rectified voltages to create a positive and negative power supply respectively across their terminals with respect to the ground reference point at their point of intersection. The final power supply voltage magnitude is proportional to the input audio signal level.

The input audio signal is also fed into the VIN+ and VIN− pins of level-shift PWM IC 311. In the preferred embodiment of the present invention IC 311 is the IR2171 integrated circuit chip sold by the assignee of the present invention, International Rectifier Corporation of El Segundo, Calif. Integrated circuit 311 creates a 128 kHz PWM signal at the PO output pin, the duty cycle of which is proportional to the input signal level. This resulting PWM signal is used to drive the input of a gate driver IC 312, which, in the preferred embodiment of the invention, is the IR2109 high voltage half bridge driver integrated circuit sold by International Rectifier Corporation. Half bridge driver IC 312 operates switching devices Q2 and Q3 alternately with a small amount of deadtime to ensure both switches do not turn on at the same time. The deadtime is very small to avoid distortion at the output.

The above-described circuit implementation of the present invention results in a square wave at point X which has a maximum voltage of +V and a minimum voltage of −V (where V is the power supply voltage set by peak level detect circuit 302 and PWM power supply control circuit 303).

L1 and C1 form a low pass Butterworth LC filter to remove the switching frequency from the output signal leaving the audio signal at point Y to drive the load S1 (a magnetic or piezo speaker).

To eliminate a DC average voltage at point Y in the circuit and therefore avoid undesirable dissipation in the load, point Y is monitored by DC offset compensation circuit 301. If any DC average voltage is observed by circuit block 101, a signal of an opposite polarity is fed back into the input pins of level shift PWM IC 311 as an offset, thereby creating a negative feedback loop which controls and removes any DC offset at the output.

Advantageously, to reduce size and cost, the IR2171 level shift PWM IC 311, the high voltage half-bridge driver IR2109 IC 312, the DC offset compensation circuit 301, the audio peak level detect circuit 302 and the PWM power supply control circuit 303 can all be integrated in one chip.

Although the present invention has been described in relation to particular embodiments thereof, many other variations and modifications and other uses will become apparent to those skilled in the art. Therefore, the present invention is to be limited not by the specific disclosure herein, but only by the appended claims.

What is claimed is:

1. A system for amplifying an input signal, comprising:
   level-shift PWM circuitry for level-shifting and converting the input signal into a pulse width modulated signal;
   gate drive circuitry for receiving the level-shifted pulse width modulated input signal and converting the signal into gate drive signals for controlling upper and lower transistor switches arranged in a half-bridge configuration to alternatively switch a positive and negative voltage applied thereto, thereby generating an output signal having a switching frequency;
   adaptive power supply control circuitry for adjusting the magnitude of the positive and negative voltage switched by the upper and lower transistor switches in the half-bridge arrangement in accordance with the magnitude of the input signal, such that when the input signal is absent, the positive and negative voltage switched is reduced to a low level to reduce switching losses and, when the input signal increases, the positive and negative voltage switched is increased by an amount proportional to the input signal level; and
   filter circuitry for removing the switching frequency from the output signal to generate an amplified system output signal to be applied to a load.

2. The system of claim 1, wherein the adaptive power supply control circuitry comprises a pulse width modulated power supply control circuit connected to an audio peak level detection circuit for detecting the magnitude of the input signal.

3. The system of claim 1, wherein the filter circuitry comprises an LC filter.

4. The system of claim 1, wherein the input signal and the amplified system output signal comprise audio signal, and the load comprises a speaker.

5. The system of claim 1, further comprising DC offset compensation circuitry for receiving the amplified system output signal and feeding back to the input signal a small level of DC offset to eliminate any DC offset in the amplified system output signal.

6. The system of claim 1, wherein the level-shift PWM circuitry, the gate drive circuitry, the adaptive power supply control circuitry, and the DC offset compensation circuitry are all integrated in one chip.

7. A method for amplifying an input signal, comprising the steps of:
   level-shifting and converting the input signal into a pulse width modulated signal;
   converting the level-shifted pulse width modulated input signal into gate drive signals for controlling upper and lower transistor switches arranged in a half-bridge configuration to alternatively switch a positive and negative voltage applied thereto, thereby generating an output signal having a switching frequency;

adjusting the magnitude of the positive and negative voltage switched by the upper and lower transistor switches in the half-bridge arrangement in accordance with the magnitude of the input signal, such that when the input signal is absent, the positive and negative voltage switched is reduced to a low level to reduce switching losses and, when the input signal increases, the positive and negative voltage switched is increased by an amount proportional to the input signal level; and removing the switching frequency from the output signal to generate an amplified system output signal to be applied to a load.

8. The method of claim 7, wherein the step of adjusting the magnitude of the voltage switched by the upper and lower transistor switches is performed by monitoring the amplitude of the input signal and generating a pulse width modulated power supply voltage having an amplitude controlled in accordance with the magnitude of the input signal.

9. The system of claim 7, wherein the step of removing the switching frequency from the output signal is performed by an LC filter.

10. The method of claim 7, wherein the input signal and the amplified system output signal comprise audio signals, and the load comprises a speaker.

11. The method of claim 7, further comprising the step of feeding back to the input signal a small level of DC offset in the amplified system output signal to eliminate any DC offset in the amplified system output signal.

* * * * *